United States Patent [19]

Nakamura et al.

[11] Patent Number: 5,126,814
[45] Date of Patent: Jun. 30, 1992

[54] PHOTOELECTRIC CONVERTER WITH DOPED CAPACITOR REGION

[75] Inventors: Yoshio Nakamura, Atsugi; Hayao Ohzu, Fuchu, both of Japan

[73] Assignee: Tokyo, Japan Canon Kabushiki Kaisha, Tokyo, Japan

[21] Appl. No.: 758,399

[22] Filed: Sep. 4, 1991

Related U.S. Application Data

[63] Continuation of Ser. No. 432,308, Nov. 3, 1989, abandoned, which is a continuation of Ser. No. 128,211, Dec. 3, 1987, abandoned.

[30] Foreign Application Priority Data

Dec. 9, 1986 [JP] Japan .................... 61-291591

[51] Int. Cl.⁵ .................... H01L 29/72; H01L 27/14
[52] U.S. Cl. .................... 357/30; 357/51; 357/34
[58] Field of Search .................... 357/30, 51, 34

[56] References Cited

U.S. PATENT DOCUMENTS

| | | | |
|---|---|---|---|
| 3,519,897 | 7/1970 | Ferrell | 357/14 |
| 3,577,038 | 5/1971 | Cook | 357/51 |
| 3,624,428 | 11/1971 | Weimer | 357/32 |
| 3,992,232 | 11/1976 | Kaji et al. | 367/52 |
| 4,001,869 | 1/1977 | Brown | 357/23.6 |
| 4,413,401 | 11/1983 | Klein et al. | 357/23.6 |
| 4,686,554 | 8/1987 | Ohmi et al. | 357/30 |

*Primary Examiner*—Jerome Jackson, Jr.
*Attorney, Agent, or Firm*—Fitzpatrick, Cella, Harper & Scinto

[57] ABSTRACT

A photoelectric converter made of a semiconductor transistor of the type that the potential of a control electrode region is controlled through a capacitor, wherein the capacitor is constructed such that the capacitor electrode faces the control electrode region with an insulating layer interposed therebetween, and at least the portion of the control electrode region which faces said capacitor electrode is a region having a high impurity density.

14 Claims, 4 Drawing Sheets

PHOTOELECTRIC CONVERTER WITH DOPED CAPACITOR REGION

This application is a continuation of application Ser. No. 07/432,308 filed Nov. 3, 1989, which is a continuation of application Ser. No. 07/128,211 filed Dec. 3, 1987 both now abandoned.

BACKGROUND OF THE INVENTION

1. Field of the Invention

The present invention relates to a photoelectric converter made of a semiconductor transistor of the type wherein the potential of a control electronic region is controlled through a capacitor.

2. Related Background Art

FIG. 5A is a schematic plan view showing the pattern of a conventional photoelectric converter, and FIG. 5B is a sectional view showing a photoelectric converter cell as taken along line A—A' of FIG. 5A.

In FIGS. 5A and 5B, formed on an n-type silicon substrate 1 is an n$^-$ epitaxial layer 4 within which photoelectric conversion cells are formed to be electrically insulated from each other by element isolation regions 6.

Formed on the n$^-$ epitaxial layer 4 is a p$^-$ base region 9 within which an n$^-$ emitter region 15 is formed. A capacitor electrode 14 is formed on the p$^-$ base region 9 with an oxide film 12 interposed therebetween to control the potential of the p$^-$ base region 9. An emitter electrode 19 is formed to be connected to the n$^-$ emitter region 15.

Also formed are an electrode connected to the capacitor electrode 14, an n$^-$ region 2 at the back of the substrate 1 for use in ohmic contact, and a collector electrode 21, respectively for the bipolar transistor. Thus, a photoelectric conversion cell is constructed.

In fundamental operation of a photoelectric conversion cell, first the p$^-$ base region 9 biased negative is made float so that the holes of light-induced electron-/hole pairs are stored in the p$^-$ base region 9 (storage operation).

Succeedingly, a positive pulse is applied to the capacitor electrode to forward bias the emitter-base junction and read a voltage generated by the stored holes from the floating emitter (readout operation).

Next, the emitter is grounded and the capacitor electrode 14 is supplied with a positive pulse to thereby remove the stored holes in the p$^-$ base region 9 When the positive refresh pulse falls, the p$^-$ base region 9 recovers its initial state (refresh operation).

In such a photoelectric converter, stored charges are amplified using the amplification function of each cell and thereafter they are read. Therefore, a high output power, high sensitivity and low noise can be achieved. Moreover, since it has simple construction, it is advantageous for high resolution of photoelectric converters in future. However, the conventional photoelectric converter has such a construction that the capacitor electrode 14 faces the base region 9 of low impurity density. Thus, there arises a problem that the operation is not stable to thereby cause read-out signals to fluctuate.

Namely, depending upon a voltage pulse applied to the capacitor electrode 14, the interface between the oxide film 12 and the p$^-$ base region 9 is subjected to storage, depletion and inversion state one after another. As the state changes, the capacitance changes which may cause a dark current.

Further, in case a plurality of photoelectric conversion cells are arrayed, all the cells are not subjected to a uniform change of the state. Therefore, read-out signals are caused to fluctuate and a fixed pattern noise may be generated.

SUMMARY OF THE INVENTION

It is an object of the present invention to reduce the fixed pattern noise of a conventional photoelectric converter.

It is another object of the present invention to provide a photoelectric converter capable of stabilizing the capacitance of the base region.

To achieve the above objects of the present invention, an aspect of the photoelectric converter embodying the present invention resides in that in a photoelectric converter made of a semiconductor transistor of the type wherein the potential of a control electrode region is controlled through a capacitor, the capacitor is constructed such that the capacitor electrode faces the control electrode region with an insulating layer interposed therebetween, and at least the portion of said control electrode region which faces said capacitor electrode is formed using a region having a high impurity density.

Since at least the portion facing the capacitor electrode is made with a high density control electrode region, the interface between the control electrode region and the insulating layer becomes stable and hence the degree of fluctuation of read-out signals is lowered.

Other objects and aspects of the present invention will become apparent from the following detailed description when read in conjunction with the accompanying drawings.

DETAILED DESCRIPTION OF THE PREFERRED EMBODIMENTS

Figure 1A:
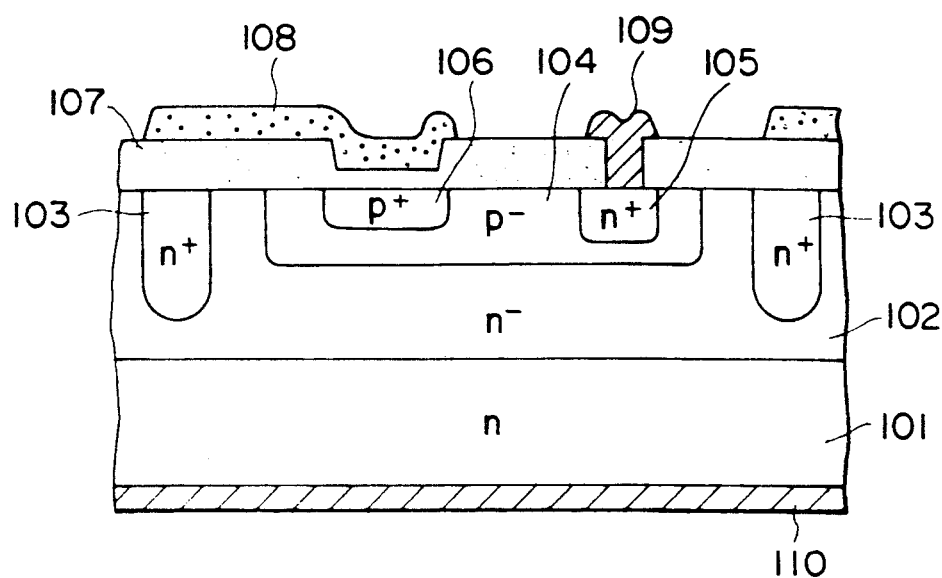
FIG. 1A is a schematic and sectional view of an embodiment of a photoelectric converter according to the present invention.
Figure 1B:
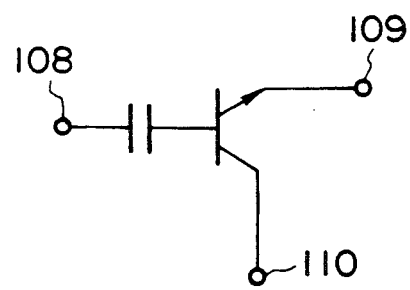
FIG. 1B is an equivalent circuit of the photoelectric conversion cell shown in FIG. 1A.

The embodiments of the present invention will be described in detail with reference to the accompanying drawings.

In the Figures, formed on an n-type silicon substrate 101 by means of the epitaxial growth method is an n$^-$ region 102 within which photoelectric conversion cells are formed to be surrounded by element isolation regions 103. A bipolar transistor serving as a photoelectric conversion cell comprises an n$^-$ collector region 102 (a first main electrode region), a p$^-$ base region 104 and an $n^+$ emitter region 105 (a second main electrode region).

To improve the sensor sensitivity, it is desirable to lower the impurity density of the $p^-$ base region 104 and make the base-emitter capacitance Cbe small. However, if the impurity density is made too small, the base region becomes entirely depleted during the operation and hence driven in a punching-through state. In this example, the impurity density of the $p^-$ base region 104 was set at approximately $10^{16}$ cm$^{-3}$.

Within the $p^-$ base region 104, there was formed a $p^+$ region 106 having a high impurity density of approximately $10^{18}$ cm$^{-3}$. The $p^+$ region 106 was formed facing a capacitor electrode 108 made of polysilicon with an oxide film 107 interposed therebetween, to thus form a capacitor which controls the base potential.

The oxide film constituting a part of the capacitor is made thin, while the other portion is formed sufficiently thick so as not to give any effect upon the base region 104 and other regions.

An emitter electrode 109 made of material such as aluminum is formed in contact with the $n^+$ emitter region 105, and a collector electrode 110 is also formed at the back of the substrate 101 with an ohmic contact layer interposed therebetween.

The fundamental operation of the photoelectric conversion cell of this embodiment is similar to that of a conventional one: the potential of the $p^-$ base region 104 is controlled by a voltage applied to the capacitor electrode 108 to thereby conduct readout, refresh and storage operation. During such operation, since the $p^+$ region 106 of a high impurity density faces the capacitor electrode 108, the state of the interface between the $p^+$ region 106 and the oxide film 107 is stabilized, thus enabling readout signals having no fluctuation to be obtained from a photoelectric converter composed of a plurality of photoelectric conversion cells.

Figure 2:
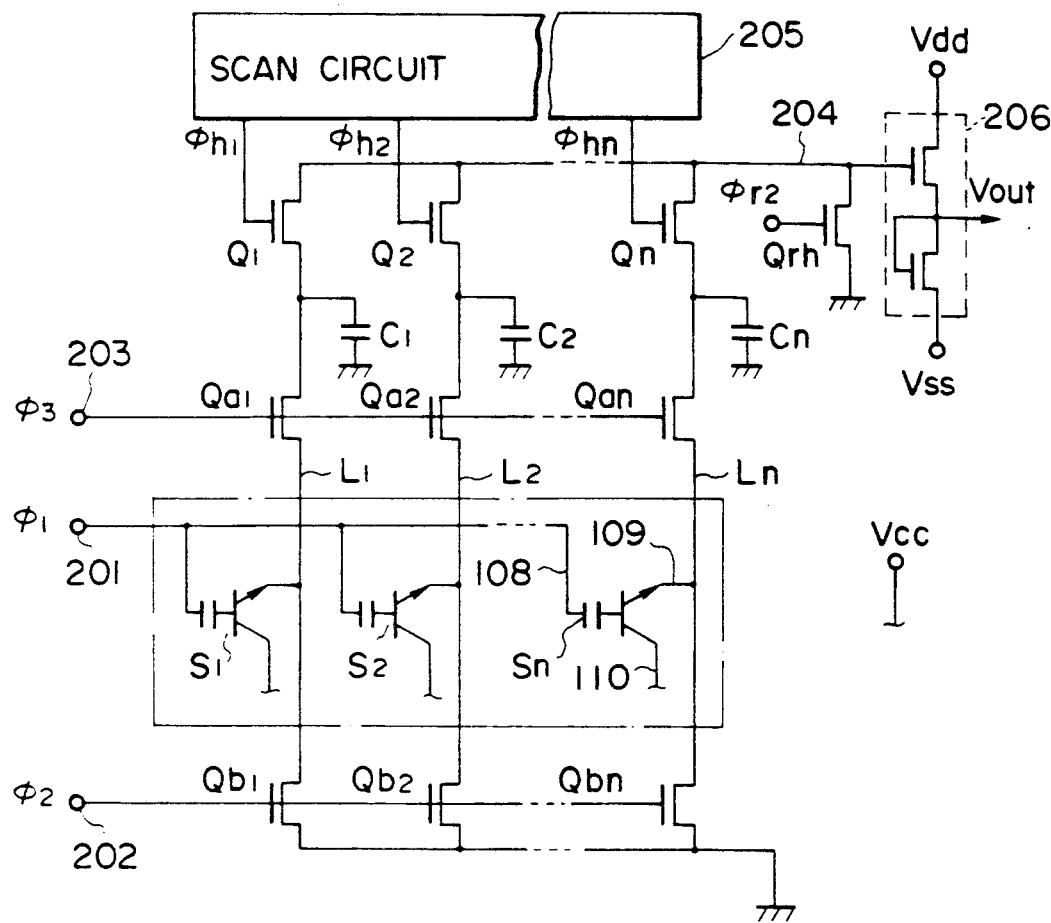
FIG. 2 is a circuit diagram of a line sensor using photoelectric conversion cells shown in FIG. 1A.

In FIG. 2, a positive voltage Vcc is applied to collector electrodes 110 of photoelectric conversion cells $S_1$ to $S_n$. Capacitor electrodes 108 are connected in common to a terminal 201 to which a pulse $\phi_1$ is applied to effect readout and refresh operation. Emitter electrodes 109 are connected to corresponding vertical lines $L_1$ to $L_n$ which are connected via respective transistors $Q_{a1}$ to $Q_{an}$ to corresponding storage capacitors $C_1$ to $C_n$. The gate electrodes of the transistors $Q_{a1}$ to $Q_{an}$ are connected in common to a terminal 203 to which a pulse $\phi_3$ is applied.

The capacitors $C_1$ to $C_n$ are connected via respective transistors $Q_1$ to $Q_n$ to an output line 204. The gate electrodes of the transistors $Q_1$ to $Q_n$ are connected to corresponding parallel output terminals of a scan circuit 205, pulses $\phi_{h1}$ to $\phi_{hn}$ being sequentially outputted from the parallel output terminals.

The output line 204 is grounded via a transistor $Q_{rh}$ which refreshes the output line. A pulse $\phi_{r2}$ is applied to the gate electrode of the transistor $Q_{rh}$.

The vertical lines $L_1$ to $L_n$ are grounded via respective transistors $Q_{b1}$ to $Q_{bn}$ the gate electrodes of which are connected in common to a terminal 202 to which a pulse $\phi_2$ is applied.

Figure 3:
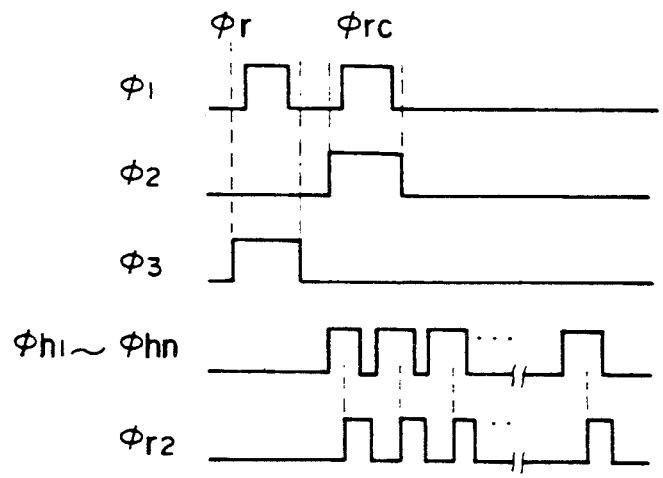
FIG. 3 is a timing chart used for explaining the operation of the photoelectric conversion cell shown in FIG. 1A.

FIG. 3 is a timing chart to be used for explaining the operation of the line sensor.

First, it is assumed that carriers corresponding to the amount of incident light have been stored in each photoelectric conversion cell $S_1$ to $S_n$. With such a condition, the transistors $Q_{a1}$ to $Q_{an}$ are turned on upon application of a pulse $\phi_2$ and the transistors $Q_{b1}$ to $Q_{bn}$ are turned off upon application of a pulse $\phi_r$, to thereby drive the emitter electrode 109 in a floating state. By applying a readout positive pulse voltage to the terminal 201, output signals are read from each cell at the floating emitter side and stored in the capacitors $C_1$ to $C_n$, as described previously. After the readout operation, the pulse $\phi_3$ is caused to fall so that the transistors $Q_{a1}$ to $Q_{an}$ are turned off.

Succeedingly, the transistors $Q_{b1}$ to $Q_{bn}$ are turned on upon application of a pulse $\phi_2$ to ground the emitter electrode 109 of each cell, and a refresh pulse $\phi_{rc}$ is applied to the terminal 201. Thus, a refresh operation is effected as described previously to remove the holes stored in the base region 104. After the refresh operation, each cell starts conducting a storage operation.

In parallel with the refresh operation, the scan circuit 205 outputs pulses $\phi_{h1}$ to $\phi_{hn}$ to sequentially turn on the transistors $Q_1$ to $Q_n$. Then, each signal stored in the capacitor $C_1$ to $C_n$ is sequentially read at the output line 204, the read-out signal is outputted as an output signal Vout via an amplifier 206.

Each time a signal is outputted, a pulse $\phi_{r2}$ is applied at timings overlapping each pulse $\phi_{h1}$ to $\phi_{hn}$. Thus, the transistor $Q_{rh}$ is turned on at those timings to thereby remove residual carriers at the output line 204 and sequentially remove residual carriers in the capacitors $C_1$ to $C_n$ via the transistors $Q_1$ to $Q_n$.

After read-out signals for all the cells $S_1$ to $S_n$ have been outputted, the next readout operation starts. The above operations are repeated in a similar manner.

As discussed previously, the photoelectric converter of this embodiment ensures a stable state of the interface so that readout signals having no fluctuation can be obtained. Thus, an output signal Vout with suppressed fixed pattern noise can be obtained.

Figure 4:
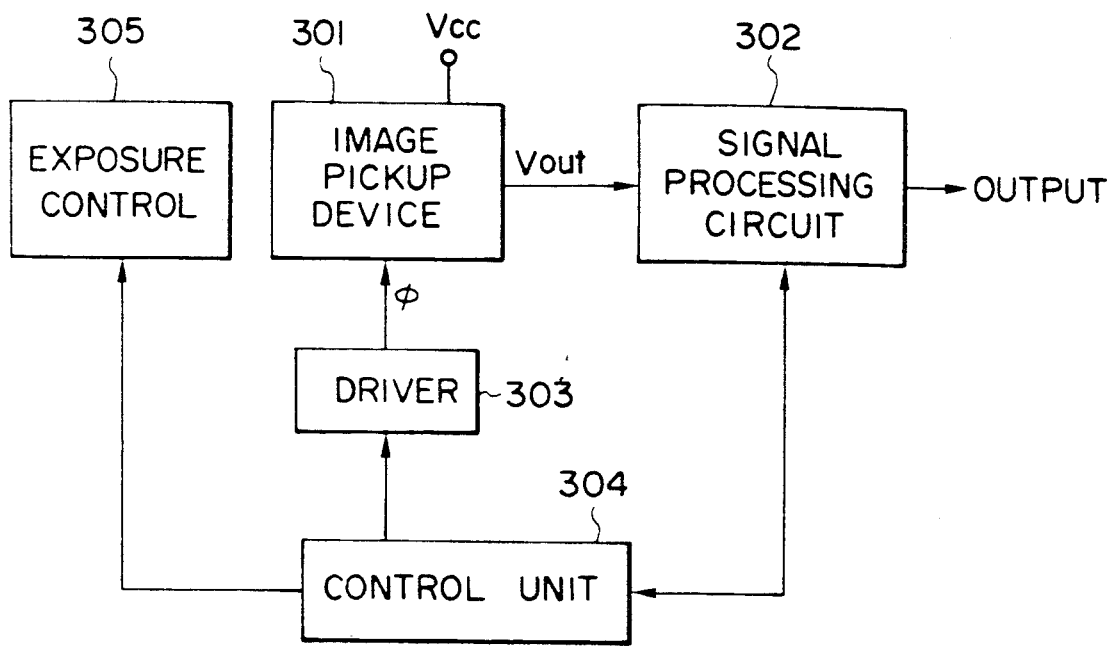
FIG. 4 is a block diagram showing an example of an image pickup device using the photoelectric converter shown in FIG. 1A.
Figure 5A:
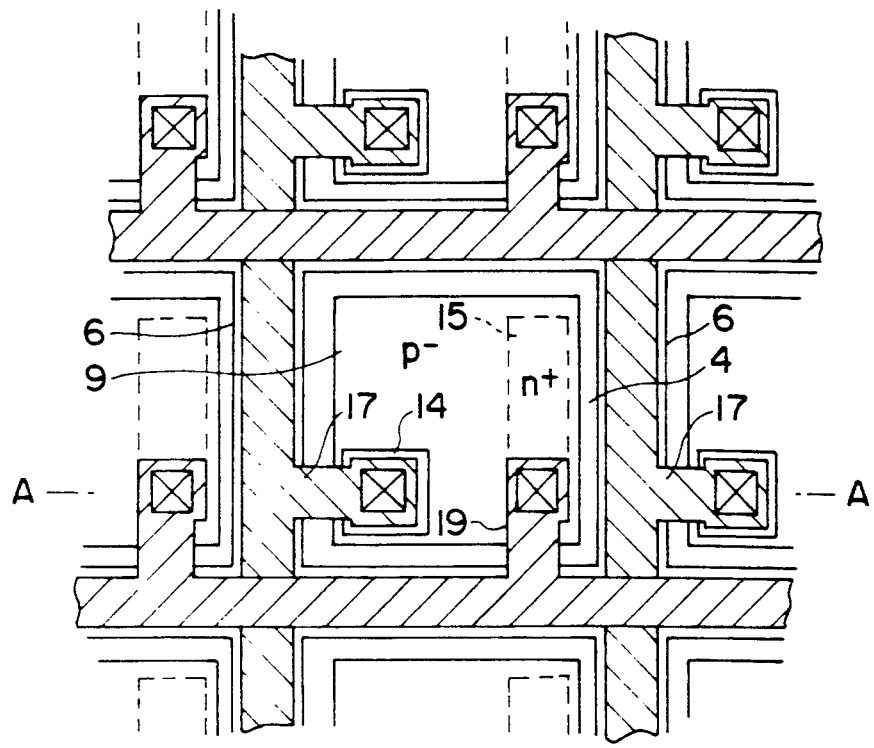
FIG. 5A is a schematic plan view showing a pattern of a conventional photoelectric converter.
Figure 5B:
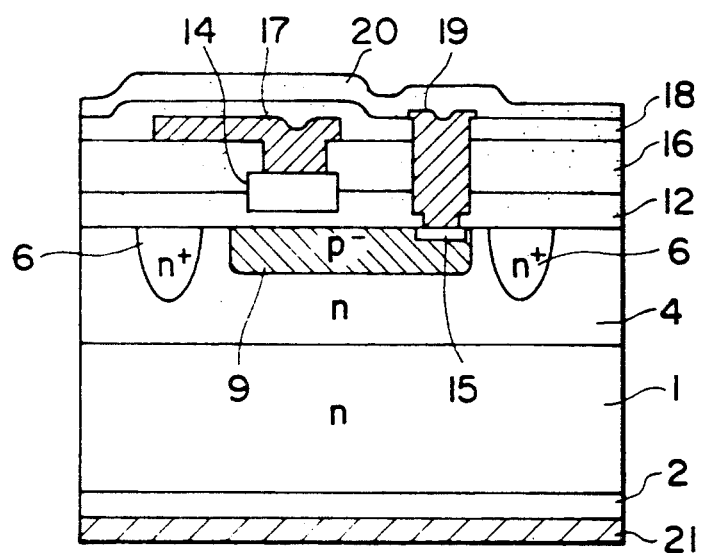
FIG. 5B is a sectional view of a photoelectric conversion cell as taken along line A—A' of FIG. 5A.

In FIG. 4, an image pickup element corresponds to the photoelectric converter shown in FIG. 2. An output signal Vout from the image pickup element 301 is subjected to gain adjustment and the like by a signal processing circuit 302 and outputted as a video signal.

The above-described pulses for use in driving the image pickup element 301 are supplied from a driver 303 which operates under control of a control unit 304. The control unit 303 operates to adjust the gain and the like of the signal processing unit 302 in accordance with an output from the image pickup element 301, and operates to adjust the light amount incident to the image pickup element 301 by controlling an exposure control 305.

Instead of the line sensor shown in FIG. 2, an area sensor may be used to obtain a television signal from the signal processing circuit 302.

As seen from the foregoing description of the photoelectric converter according to the present invention, the portion of the control electrode region which constitutes a part of the capacitor is formed to have a high density region. Therefore, the interface between the control electrode region constituting the capacitor and the insulating layer becomes stable to thereby reduce the fluctuation of read-out signals. Thus, it becomes possible to obtain a high quality image signal having no fixed pattern noise from an image pickup element constructed by the photoelectric converter of this invention.

We claim:

1. A photoelectric converter made of a semiconductor transistor, said transistor having a light receiving surface to photoelectrically convert light incident upon said surface into electrical charge, and comprising a control electrode region in which the converted electrical charge is accumulated and a capacitor for controlling the potential of said control electrode region in order to control a photoelectric conversion operation of said transistor, said capacitor being formed in a portion of said control electrode region and having a capacitor electrode a portion of which is opposite to said portion of said control electrode region with an insulating layer interposed between said capacitor electrode and said control electrode region, wherein said portion of said control electrode region has a higher impurity concentration of the same conductivity type as said control electrode region.

2. A photoelectric converter according to claim 1, wherein the impurity density of said portion of said control electrode region a high impurity density is more than $10^{18}$ cm$^{-3}$.

3. A photoelectric converter according to claim 1, wherein the impurity density of said control electrode region except said portion of said control region a high impurity density is less than $10^{16}$ cm$^{-3}$.

4. A photoelectric converter according to claim 1 further comprising a signal source for supplying said capacitor electrode with at least a floating potential and a forward bias potential.

5. An image pickup element comprising:
a) a semiconductor transistor for photoelectrically converting an image into electrical charge, comprising a control electrode region in which the converted electrical charge is accumulated, said control electrode region having a first relatively low impurity density;
b) a capacitor region having a light receiving surface in a surface of said capacitor region for controlling a photoelectric conversion operation of said transistor, said capacitor region being provided as a portion of said control electrode region and having a second impurity density higher than said first impurity density and the same conductivity type as said control electrode region; and
c) a capacitor electrode opposite said capacitor region with insulating layer interposed between said capacitor electrode and said control electrode region.

6. An image pickup element according to claim 5, wherein said first impurity density is less than $10^{16}$ cm$^{-3}$.

7. An image pickup element according to claim 5, wherein said second impurity density is more than $10^{18}$ cm$^{-3}$.

8. An image pickup element according to claim 5 further comprising a signal source for supplying said capacitor electrode with at least a floating potential and a forward bias potential.

9. An image pickup device comprising:
a) a plurality of photoelectric conversion elements, each of said photoelectric conversion elements including a semiconductor transistor which photoelectrically converts an image into converted electrical charge;
b) a respective first semiconductor region being formed in each said semiconductor transistor and having a predetermined conductivity type;
c) a respective second semiconductor region begin formed in a portion of each said first semiconductor region and having an impurity density higher than that of said first semiconductor region and the same conductivity type as said first semiconductor region;
d) an electrode facing said second semiconductor region with an insulating layer being interposed therebetween to define a capacitor between said second semiconductor region and said electrode; and
e) a light receiving surface formed in a surface of said electrode.

10. An image pickup device according to claim 9 further comprising control means for applying a common voltage signal to said electrode of each of said plurality of photoelectric conversion elements.

11. An image pickup device according to claim 9, wherein said first semiconductor region has an impurity density of less than $10^{16}$ cm$^{-3}$.

12. An image pickup device according to claim 9, wherein said second semiconductor region has an impurity density of more than $10^{18}$ cm$^{-3}$.

13. An image pickup element according to claim 5, wherein said semiconductor transistor includes a plurality of main electrode regions.

14. An image pickup element according to claim 9, wherein said semiconductor region includes a plurality of main electrode regions, wherein at least one of said main electrode regions forms a PN junction with said first semiconductor region.

* * * * *

UNITED STATES PATENT AND TRADEMARK OFFICE
CERTIFICATE OF CORRECTION

PATENT NO. : 5,126,814
DATED : June 30, 1992
INVENTOR(S) : Yoshio Nakamura et al It is certified that error appears in the above-indentified patent and that said Letters Patent is hereby corrected as shown below:

COLUMN 1

Line 27, "$n^-$" should read --$n^+$--.
Line 41, "float" should read --to float--.
Line 50, "region 9" should read --region 9.--.

COLUMN 4

Line 19, "capacitor" should read --capacitors--.
Line 45, "unit 303" should read --unit 304--.

COLUMN 5

Line 21, "region" should read --region having--.
Line 25, "region" should read --electrode region having--.

UNITED STATES PATENT AND TRADEMARK OFFICE
CERTIFICATE OF CORRECTION

PATENT NO. : 5,126,814
DATED : June 30, 1992
INVENTOR(S) : Yoshio Nakamura et al It is certified that error appears in the above-indentified patent and that said Letters Patent is hereby corrected as shown below:

<u>COLUMN 6</u>

Line 20, "begin" should read --being--.

Signed and Sealed this

Twenty-eighth Day of December, 1993

Attest:

BRUCE LEHMAN

Attesting Officer  Commissioner of Patents and Trademarks